US010629478B2

(12) United States Patent
Briggs et al.

(10) Patent No.: US 10,629,478 B2
(45) Date of Patent: Apr. 21, 2020

(54) DUAL-DAMASCENE FORMATION WITH DIELECTRIC SPACER AND THIN LINER

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, Rhinebeck, NY (US); Huai Huang, Saratoga, NY (US); Christopher J. Penny, Saratoga Springs, NY (US); Michael Rizzolo, Albany, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 15/682,773

(22) Filed: Aug. 22, 2017

(65) Prior Publication Data

US 2019/0067087 A1 Feb. 28, 2019

(51) Int. Cl.
*H01L 21/00* (2006.01)
*H01L 21/768* (2006.01)
*H01L 21/311* (2006.01)

(52) U.S. Cl.
CPC .. *H01L 21/76808* (2013.01); *H01L 21/31144* (2013.01); *H01L 21/76811* (2013.01); *H01L 2221/1031* (2013.01); *H01L 2221/1057* (2013.01)

(58) Field of Classification Search
CPC ......... H01L 21/76883; H01L 21/76886; H01L 21/76802; H01L 21/7684; H01L 21/7685; H01L 21/76843; H01L 21/76849; H01L 23/5226; H01L 23/481; H01L 2924/01079; H01L 2924/01078; H01L 2924/01029; H01L 21/76808; H01L 21/31144; H01L 21/76811; H01L 2221/1031
See application file for complete search history.

(56) References Cited

U.S. PATENT DOCUMENTS

| | | |
|---|---|---|
| 6,078,088 A | 6/2000 | Buynoski |
| 6,252,290 B1 | 6/2001 | Quek et al. |
| 6,303,486 B1 | 10/2001 | Park |
| 6,355,555 B1 | 3/2002 | Park |
| 6,577,011 B1 | 6/2003 | Buchwalter et al. |
| 6,586,839 B2 | 7/2003 | Chisholm et al. |

(Continued)

*Primary Examiner* — Hoa B Trinh
(74) *Attorney, Agent, or Firm* — Michael A. Petrocelli

(57) ABSTRACT

A method of forming a semiconductor device includes forming a dielectric spacer along sidewalls of a plurality of interconnect openings extending through a sacrificial dielectric layer and a first dielectric layer until a top portion of a first conductive material, the dielectric spacer includes a dielectric material having a dielectric constant higher than a dielectric constant of the sacrificial dielectric layer and higher than a dielectric constant of the first dielectric layer, conformally depositing a barrier liner within the plurality of interconnect openings above and in direct contact with the dielectric spacer, filling the interconnect openings with a second conductive material, removing the sacrificial dielectric layer to expose portions of the dielectric spacer above the first dielectric layer, and reducing a thickness of exposed portions of the dielectric spacer.

20 Claims, 10 Drawing Sheets

(56) References Cited

U.S. PATENT DOCUMENTS

| | | | |
|---|---|---|---|
| 6,737,744 B2 * | 5/2004 | Fukuyama | H01L 21/76813 257/750 |
| 7,301,107 B2 * | 11/2007 | Karthikeyan | H01L 21/565 174/258 |
| 7,338,893 B2 | 3/2008 | Engbrecht et al. | |
| 7,358,148 B2 * | 4/2008 | Geffken | H01L 21/76811 257/E21.579 |
| 8,021,954 B2 | 9/2011 | Chu | |
| 8,138,082 B2 | 3/2012 | Torres et al. | |
| 8,178,437 B2 * | 5/2012 | Chang | H01L 21/76814 257/751 |
| 8,357,609 B2 | 1/2013 | Ryan | |
| 8,564,136 B2 | 10/2013 | Tsutsue | |
| 2002/0177303 A1 | 11/2002 | Jiang et al. | |
| 2007/0087551 A1 | 4/2007 | Gambino | |

* cited by examiner

DUAL-DAMASCENE FORMATION WITH DIELECTRIC SPACER AND THIN LINER

BACKGROUND

The present invention generally relates to semiconductor devices, and more particularly to lowering capacitance and resistance while improving reliability of semiconductor devices during back-end-of-the-line (BEOL) integration processes.

Typical components of an integrated circuit include transistors, capacitors, and the like. In semiconductor chip fabrication, these components are coupled by interconnect structures to conduct current through the different circuit layers. Such interconnect structures typically take the shape of wires, trenches, or vias formed in dielectric layers above the microelectronic devices and may typically be formed by depositing a dielectric layer, etching a recess in the dielectric layer and filling the recess with a metal. Currently, interconnect structures are usually made of copper and may be formed using a single-damascene or dual-damascene fabrication process. In the single-damascene process, interconnect structures (vias and trenches) are manufactured independently, while in the dual-damascene process are manufactured at the same time.

SUMMARY

According to an embodiment of the present disclosure, a method of forming a semiconductor device may include forming a dielectric spacer along sidewalls of a plurality of interconnect openings extending through a sacrificial dielectric layer and a first dielectric layer until a top portion of a first conductive material, the dielectric spacer may include a dielectric material having a dielectric constant higher than a dielectric constant of the sacrificial dielectric layer and higher than a dielectric constant of the first dielectric layer, conformally depositing a barrier liner within the plurality of interconnect openings, the barrier liner may be deposited above and in direct contact with the dielectric spacer, filling the interconnect openings with a second conductive material, removing the sacrificial dielectric layer to expose portions of the dielectric spacer directly above the first dielectric layer, and reducing a thickness of exposed portions of the dielectric spacer.

According to another embodiment of the present disclosure, a method of forming a semiconductor device may include depositing a sacrificial dielectric layer directly above a first dielectric layer, the first dielectric layer is directly above a first metal level of the semiconductor device, forming a plurality of interconnect openings extending through the sacrificial dielectric layer and the first dielectric layer until a top portion of a first conductive material in the first metal level, conformally depositing a dense dielectric material along a first perimeter formed by top surfaces of the sacrificial dielectric layer, sidewalls of the plurality of interconnect openings and a bottom of the plurality of interconnect openings, the dense dielectric material has a dielectric constant higher than a dielectric constant of the sacrificial dielectric layer and higher than a dielectric constant of the first dielectric layer, removing the dense dielectric material from areas of the semiconductor device parallel to the first metal level, the dense dielectric material may remain on sidewalls of the plurality of interconnect openings to form dense dielectric spacers, depositing a barrier liner in direct contact with top surfaces of the sacrificial dielectric layer, the dense dielectric spacers and the bottom of the plurality of interconnect openings, depositing a second conductive material above and in direct contact with the barrier liner, the second conductive material fills the plurality of interconnect openings to form interconnect structures, planarizing the conductive material, during planarization of the conductive material the barrier liner is removed from above top surfaces of the sacrificial dielectric layer, removing the sacrificial dielectric layer such that portions of the dense dielectric spacers above the first dielectric layer are exposed, and reducing a thickness of exposed portions of the dense dielectric spacers.

According to an embodiment of the present disclosure, a semiconductor device may include a plurality of interconnect structures extending through a first dielectric layer and a second dielectric layer until a top surface of a first metal level, the second dielectric layer is above the first dielectric layer, a conductive material within each interconnect structure, the conductive material is directly above a barrier liner, a thinned dielectric spacer in direct contact with a first portion of the barrier liner directly above the first dielectric layer and in direct contact with the second dielectric layer, and a dielectric spacer in direct contact with a second portion of the barrier liner located below the second dielectric layer and in direct contact with the first dielectric layer, the thinned dielectric spacer and the dielectric spacer may include a dielectric constant higher than a dielectric constant of the first dielectric layer and higher than a dielectric constant of the second dielectric layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
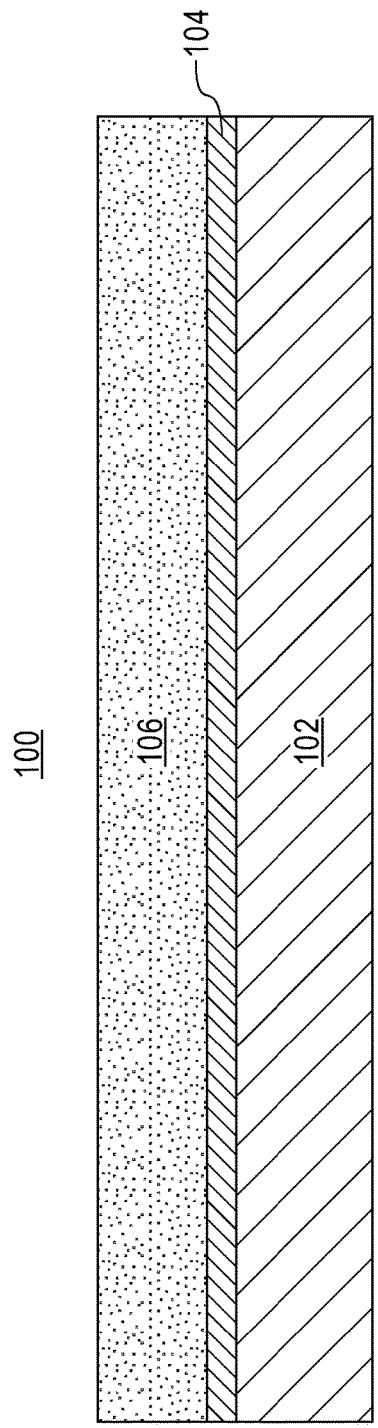
FIG. 1 depicts a cross-sectional view of a semiconductor device, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may not be described in detail. In other instances, some processing steps or operations that are known in the art may not be described at all. It should be understood that the following description is rather focused on the distinctive features or elements of various embodiments of the present invention.

As feature sizes are reduced and the number of devices per unit area as well as the number of interconnect levels are increased, the speed of propagation of interconnect signals represents one of the most relevant factors controlling the overall circuit speed. Throughout the semiconductor industry, there has been a strong drive to reduce the dielectric constant, k, of the interlevel dielectric (ILD) materials used to electrically insulate metal lines and other conductive features. Using dielectric materials with lower dielectric constants reduces resistance-capacitance (RC) delays and allows interconnect signals to travel faster through the various metal conductors.

Typically, state-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an iterative additive process, called dual-damascene, which includes several processing steps including, for example, film deposition, patterning by lithography, reactive ion etching, liner (Cu barrier) deposition, Cu metal fill by electrochemical plating, and chemical-mechanical polishing of excessive Cu metal.

Unfortunately, low-k materials (typically dielectrics whose dielectric constant is below that of silicon oxide) exhibit fundamentally weaker electrical and mechanical properties as compared to silicon oxide which make them susceptible to damage during the various processing steps. The damage observed in the low-k materials is manifested by an increase in the dielectric constant and increased moisture uptake, which may result in reduced performance and device reliability.

An alternative to improve device performance (e.g., reduce resistance and capacitance values) may include forming interconnect structures having a substantially thin barrier liner; however current use of low-k materials in back-end-of-the-line (BEOL) integration processes and, particularly, in dual-damascene integration schemes, may hinder the formation of ultrathin barrier liners for the reasons described above.

Therefore, by forming a sacrificial dielectric layer and a thinned dense dielectric spacer prior to deposition of a barrier liner, embodiments of the present disclosure may, among other potential benefits, allow the formation of a substantially thinner (e.g., ultrathin) barrier liner and back-filling with low-k dielectric materials after removal of the sacrificial dielectric layer. As such both resistance and capacitance may be reduced while improving barrier properties and reliability of semiconductor devices.

The present invention generally relates to semiconductor devices, and more particularly to lowering capacitance and resistance while improving reliability of semiconductor devices during BEOL integration processes.

One way to lower capacitance and resistance may include forming a sacrificial dielectric layer and a thinned dense dielectric spacer to allow the formation of a substantially thin barrier liner. One embodiment by which the sacrificial dielectric layer, thinned dense dielectric spacer, and substantially thin barrier liner may be formed is described in detailed below by referring to the accompanying drawings in FIGS. 1-11.

Referring now to FIG. 1, a cross-sectional view of a semiconductor device 100 is shown, according to an embodiment of the present disclosure. In this embodiment, the semiconductor device 100 may include, for example, a finished pre-level 102 (hereinafter "pre-level"). More specifically, the pre-level 102 may include a partially formed integrated circuit structure. In some embodiments, the pre-level 102 may include a substrate, a device level, and/or a wiring layer (not shown). If such wiring layer is the lowest wiring level then the pre-level 102 may be referred to as a first metal level or $M_X$ level.

A first cap layer 104 may be formed above the pre-level 102. The cap layer 104 may be deposited above the pre-level 102 by any deposition method known in the art such as chemical vapor deposition (CVD), plasma-enhanced chemical vapor deposition (PECVD), high-density CVD (HD-CVD), or physical vapor deposition (PVD). The first cap layer 104 may have a thickness varying from approximately 15 nm to approximately 30 nm and ranges there between, although a thickness less than 15 nm and greater than 30 nm may be acceptable.

The first cap layer 104 may be provided in cases where the pre-level 102 includes copper (Cu) as the conductive material. The first cap layer 104 may include an insulator of silicon nitride, silicon carbide, nitrogen doped silicon carbide, oxygen doped silicon carbide or the like which may function as both a barrier, particularly when a low-k material that may be subject to diffusion of moisture is used in the pre-level 102 as interlevel dielectric (ILD), and an etch stop for a subsequent via level. In an embodiment of the present disclosure, the first cap layer 104 may include a dielectric material such as nitrogen-doped silicon carbide (NBLoK).

At this point of the fabrication process, the semiconductor device 100 may also include a first dielectric layer 106 positioned above and in direct contact with the first cap layer 104. The first dielectric layer 106 may be deposited directly above the first cap layer 104 by any suitable deposition process such as, for example, CVD, PECVD, HDCVD, PVD, plating, sputtering, evaporation, and chemical solution deposition of a dielectric material. The first dielectric layer 106 may include, for example, a low-k dielectric material having a dielectric constant, k, in the range of approximately 2.4 to approximately 2.7. In some embodiments, the first dielectric layer 106 may include an octamethylcyclotetrasiloxane (OMCTS)-based dielectric material with a dielectric constant of approximately 2.7.

A thickness of the first dielectric layer 106 may vary from approximately 100 nm to approximately 500 nm and ranges there between, although a thickness less than 100 nm and greater than 500 nm may be acceptable.

Typically, the first dielectric layer 106 may be formed taking into consideration a target via height and/or thickness. For example, in a dual-damascene integration scheme, the height of a via may vary from approximately 60% to approximately 80% of the thickness of the first dielectric layer 106.

Figure 2:
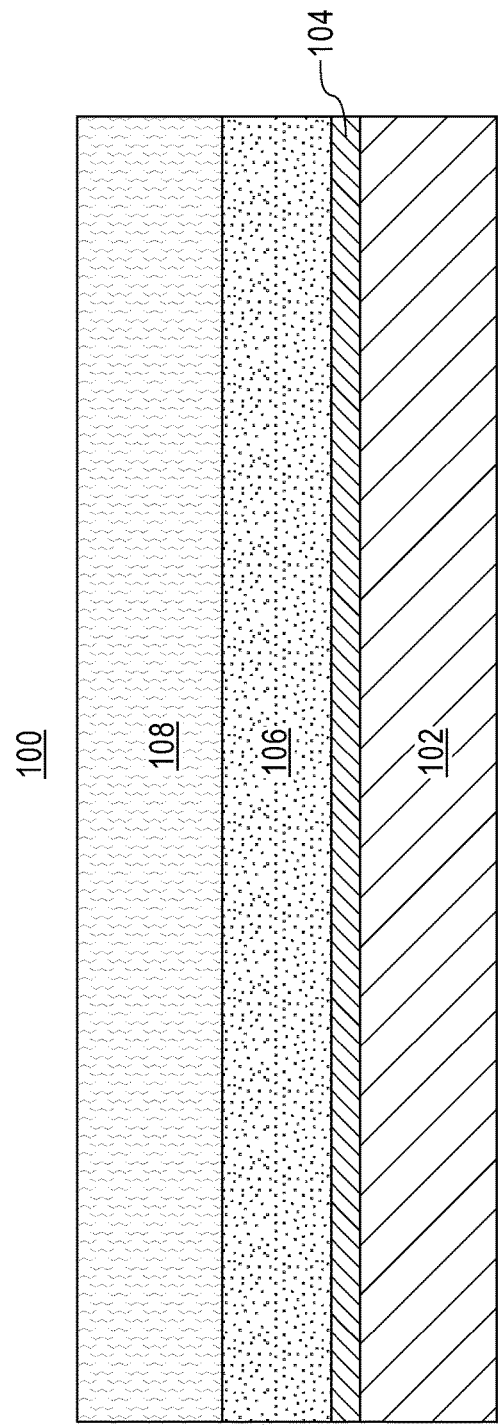
FIG. 2 depicts depositing a sacrificial dielectric layer in the semiconductor device, according to an embodiment of the present disclosure.

Referring now to FIG. 2, a cross-sectional view of the semiconductor device 100 depicting the formation of a sacrificial dielectric layer 108 is shown, according to an embodiment of the present disclosure. The sacrificial dielectric layer 108 may be formed above and in direct contact with the first dielectric layer 106. In some embodiments, the sacrificial dielectric layer 108 may include an oxide such as silicon oxide, silicon oxynitride, and the like formed by any suitable deposition process including, for example, CVD, low pressure CVD (LPCVD), PECVD, spin coating, sputtering, PVD, or thermal growing. In other embodiments the sacrificial dielectric layer 108 may include, for example, higher k dielectric materials including titanium oxide, tantalum oxide and the like.

A thickness of the sacrificial dielectric layer 108 may vary from approximately 100 nm to approximately 500 nm and ranges there between, although a thickness less than 100 nm and greater than 500 nm may be acceptable.

It should be noted that the sacrificial dielectric layer 108 may be formed taking into account a target trench height and/or thickness. For example, in a dual-damascene integration scheme, the height or depth of a trench may vary from approximately 60% to approximately 80% of the thickness of the sacrificial dielectric layer 108.

By forming the sacrificial dielectric layer 108, embodiments of the present disclosure, may enable the formation of interconnect structures (e.g., copper interconnects) in the sacrificial dielectric layer 108 in order to prevent or reduce the damage typically caused to low-k dielectrics during etching and other subsequent processing steps, some of which are described in detail below.

Figure 3:
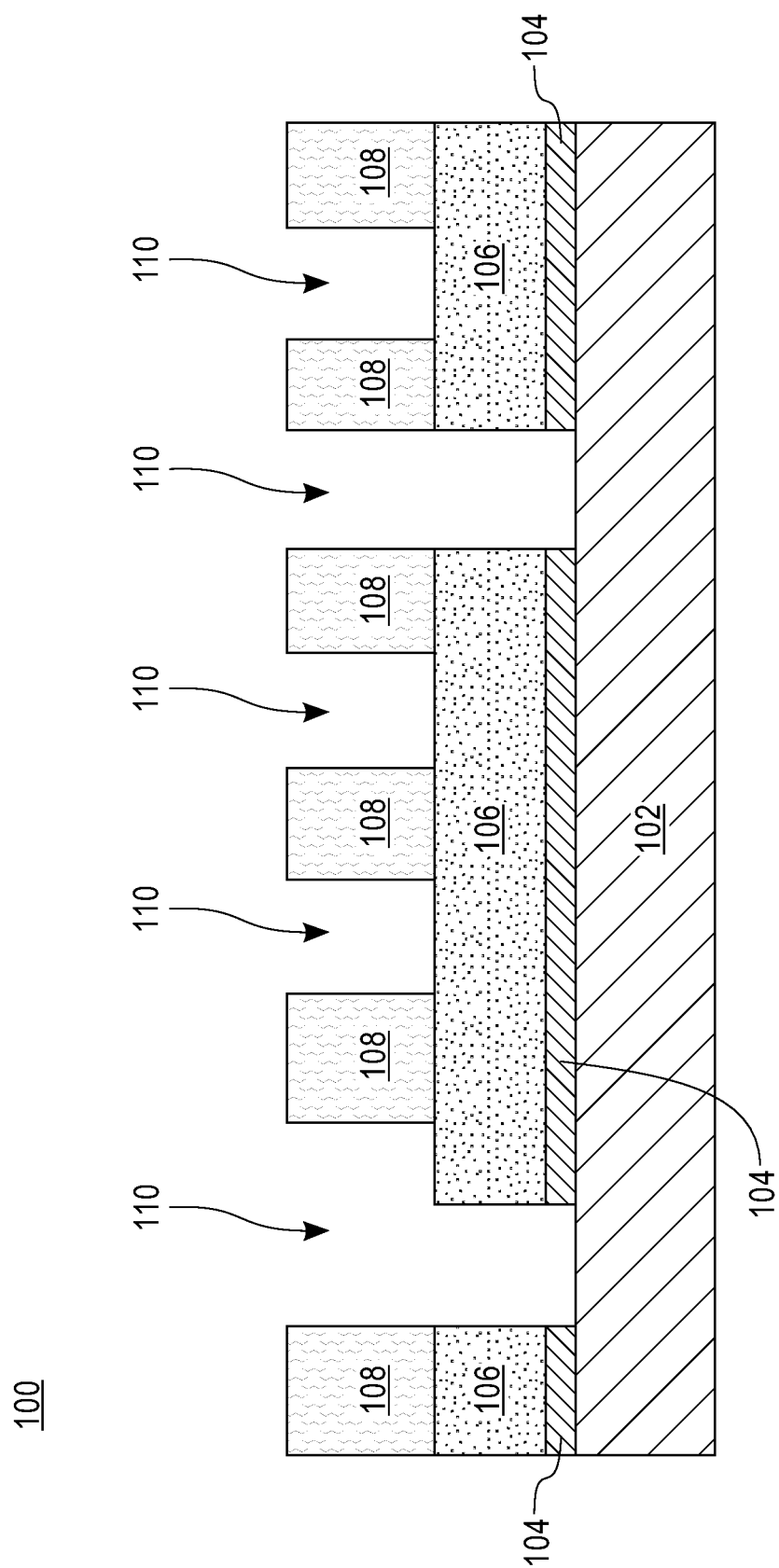
FIG. 3 depicts patterning the sacrificial dielectric layer, according to an embodiment of the present disclosure.

Referring now to FIG. 3, a cross-sectional view of the semiconductor device 100 depicting patterning of the sacrificial dielectric layer 108 is shown, according to an embodiment of the present disclosure.

At this point of the fabrication process, the sacrificial dielectric layer 108 may be patterned to form interconnect openings 110 in which interconnect structures (e.g., vias and trenches, or dual damascene trenches) will be formed in the semiconductor device 100. Particularly, the sacrificial dielectric layer 108 may be formed and patterned as both a barrier to copper out-diffusion and to form the interconnect openings 110, in accordance with a particular chip design. The interconnect openings 110 may extend through the sacrificial dielectric layer 108 and the first dielectric layer 106 until a top surface of the first cap layer 104 is reached. At this step, the first cap layer 104 may act as an etch stop. The first cap layer 104 may then be opened using the patterned sacrificial dielectric layer 108 as a mask by means of methods well-known in the art.

In this embodiment, the first dielectric layer 106 may act as a wiring layer and may be connected to the pre-level 102 (e.g., first metal level) underneath by one or more of the interconnect openings 110. As a result, if placed on top of the pre-level 102, the first dielectric layer 106 may be identified as a second metal level or $V_X/M_{X+1}$ level, since it may be the first level with vias and the second level with metal interconnects. The interconnect openings 110 in the first dielectric layer 106 may represent a dual-damascene structure since two different patterning processes may be employed in forming the different depths of the wiring trenches and vias. However, other interconnect/metal structures may be employed to which the invention may be equally applicable.

The interconnect openings 110 may be formed by applying lithographic methods and anisotropic etch. For example, a hardmask layer (not shown) may be formed over a blanket film of the sacrificial dielectric layer 108 without any pattern, and then lithographically patterned. The pattern in the hardmask layer may be transferred into the blanket film by vertically recessing exposed portions of the sacrificial dielectric layer 108 forming the interconnect openings 110. An anisotropic etch such as a reactive ion etch may be used to recess the exposed surfaces of the sacrificial dielectric layer 108. The hardmask layer may be subsequently removed selective to the sacrificial dielectric layer 108. The lithographic patterning may be employed repeatedly to form the interconnect openings 110 according to a determined chip design.

It should be noted that the interconnect openings 110 may extend until a top portion of a conductive material (not shown) in the pre-level 102 is exposed. This step may include removal of a portion of the first cap layer 104 located above the conductive material in the pre-level 102, as explained above.

Figure 4:
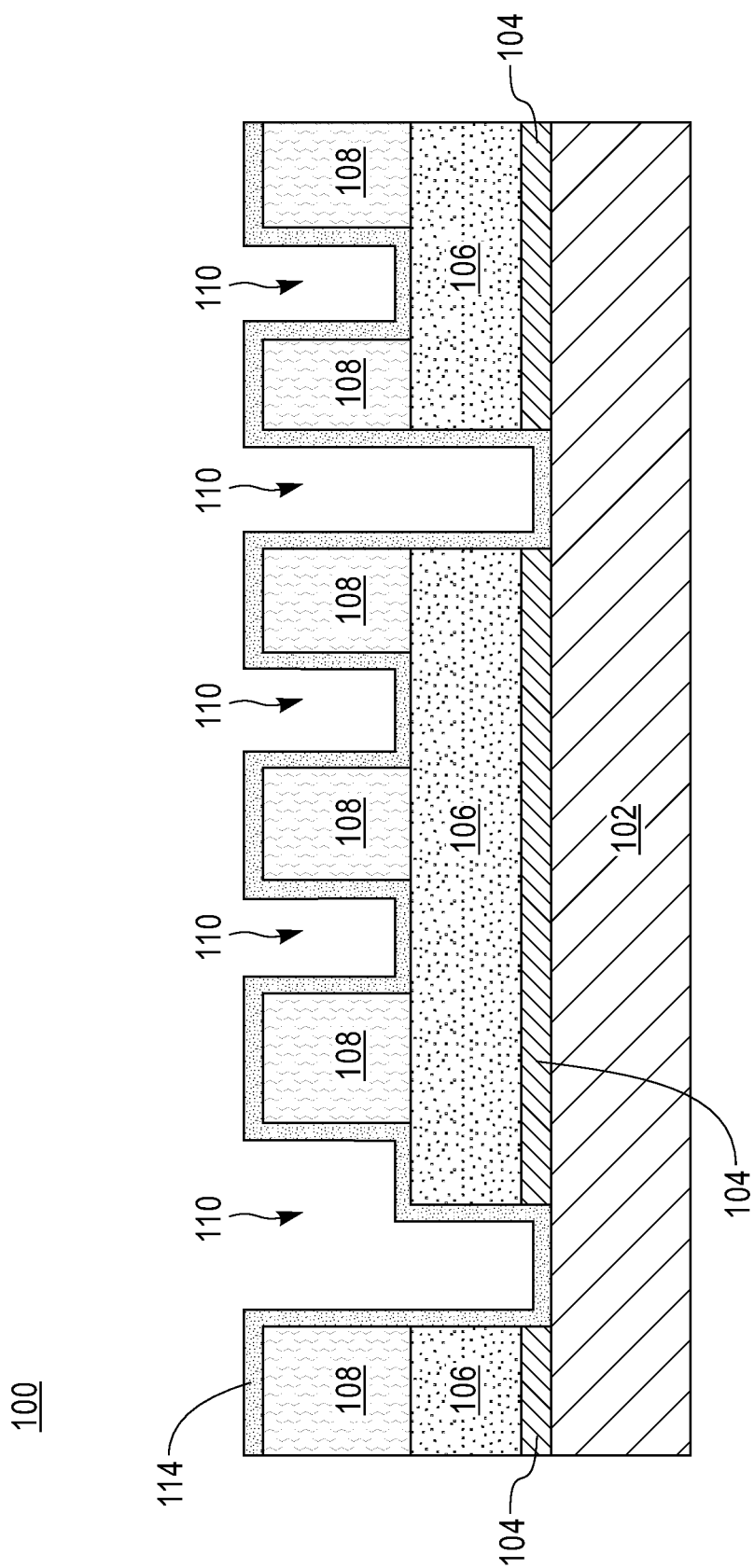
FIG. 4 depicts conformally depositing a dense dielectric spacer, according to an embodiment of the present disclosure.

Referring now to FIG. 4, a cross-sectional view of the semiconductor device 100 depicting the deposition of a dense dielectric spacer 114 is shown, according to an embodiment of the present disclosure. The dense dielectric spacer 114 may be conformally deposited in the semiconductor device 100. More specifically, the dense dielectric spacer 114 may be conformally deposited along a perimeter formed by the interconnect openings 110 and exposed uppermost surfaces of the sacrificial dielectric layer 108.

The dense dielectric spacer 114 may include, for example, silicon oxide, silicon carbon nitride (SiCN), silicon carbide (SiC), or any other suitable dielectric material having a dielectric constant, k, similar or higher than a dielectric constant of the sacrificial dielectric layer 108, and higher than a dielectric constant of the first dielectric layer 106. More specifically, the dense dielectric spacer 114 may include a dielectric material having a dielectric constant varying between approximately 3 to approximately 6. It should be noted that the word "dense" is used to identify a dielectric material having a dielectric constant higher than that of other dielectric materials present in the semiconductor device 100.

The dense dielectric spacer 114 may be formed by PECVD, spin-on-deposition, or ALD. The dense dielectric spacer 114 may have a thickness varying from approximately 0.5 nm to approximately 10 nm.

The denser (higher k) dielectric material used to form the dense dielectric spacer 114 may enhance nucleation of a subsequently formed barrier liner (FIG. 6) allowing a thickness of such barrier liner to be substantially reduced in comparison to a thickness of typical barrier liners formed in current dual-damascene integration schemes.

Figure 5:
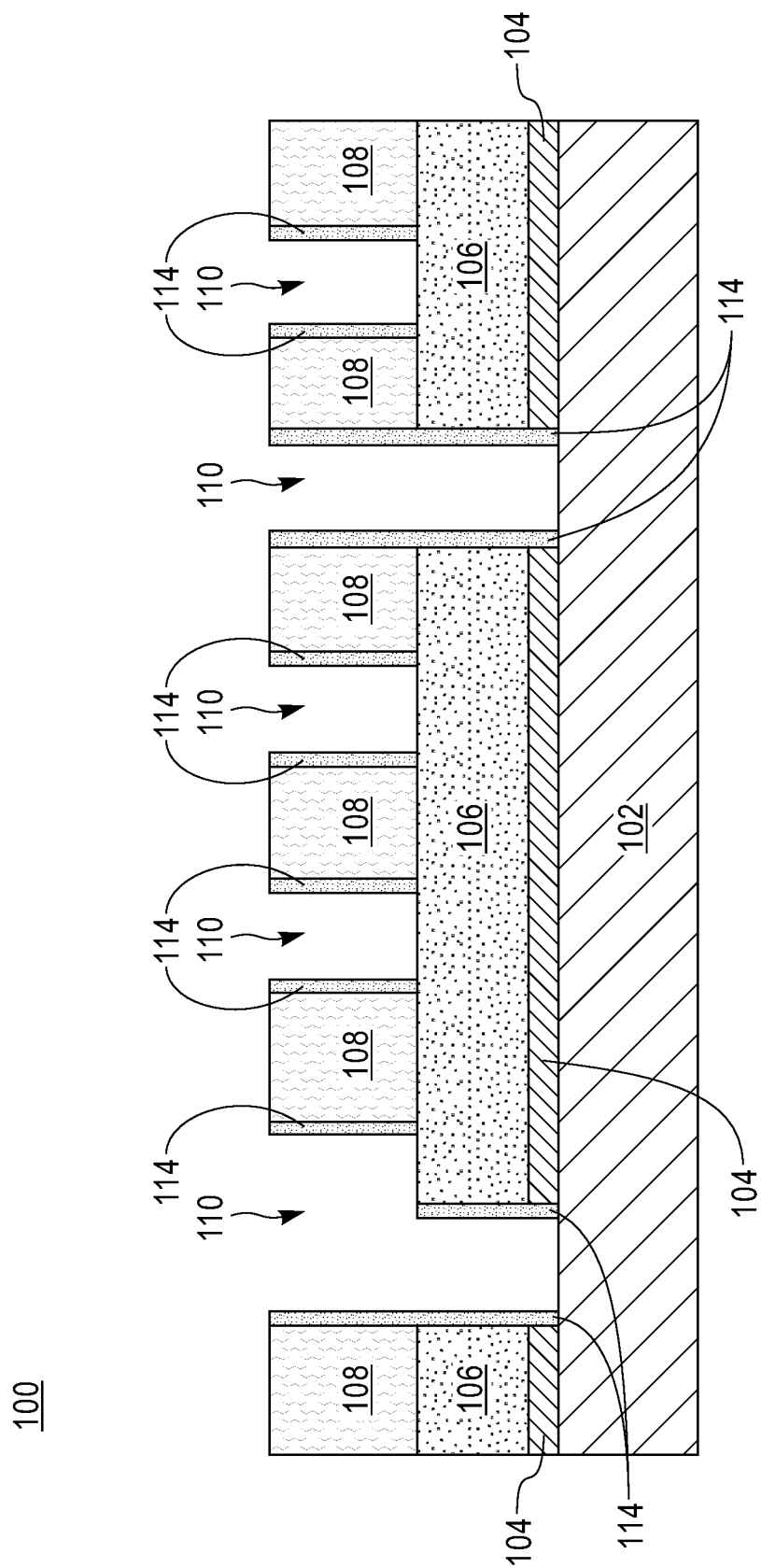
FIG. 5 depicts etching the dielectric spacer material, according to an embodiment of the present disclosure.

Referring now to FIG. 5, a cross-sectional view of the semiconductor device 100 depicting removing portions of the dense dielectric spacer 114 is shown, according to an embodiment of the present disclosure. At this step, portions of the dense dielectric spacer 114 located on top surfaces of the sacrificial dielectric layer 108 and bottom of the interconnect openings 110 may be removed. Stated differently, the dense dielectric spacer 114 may be removed from areas of the semiconductor device 100 parallel to the pre-level 102. As illustrated in FIG. 5, the dense dielectric spacer 114 may remain on sidewalls of the interconnect openings 110.

Portions of the dense dielectric spacer 114 may be selectively removed by, for example, a selective reactive ion etching technique. In some embodiments, wet-chemical etching and cleaning may be used to remove the dense dielectric spacer 114 from top surfaces of the sacrificial dielectric layer 108 and bottom of the interconnect openings 110.

Figure 6:
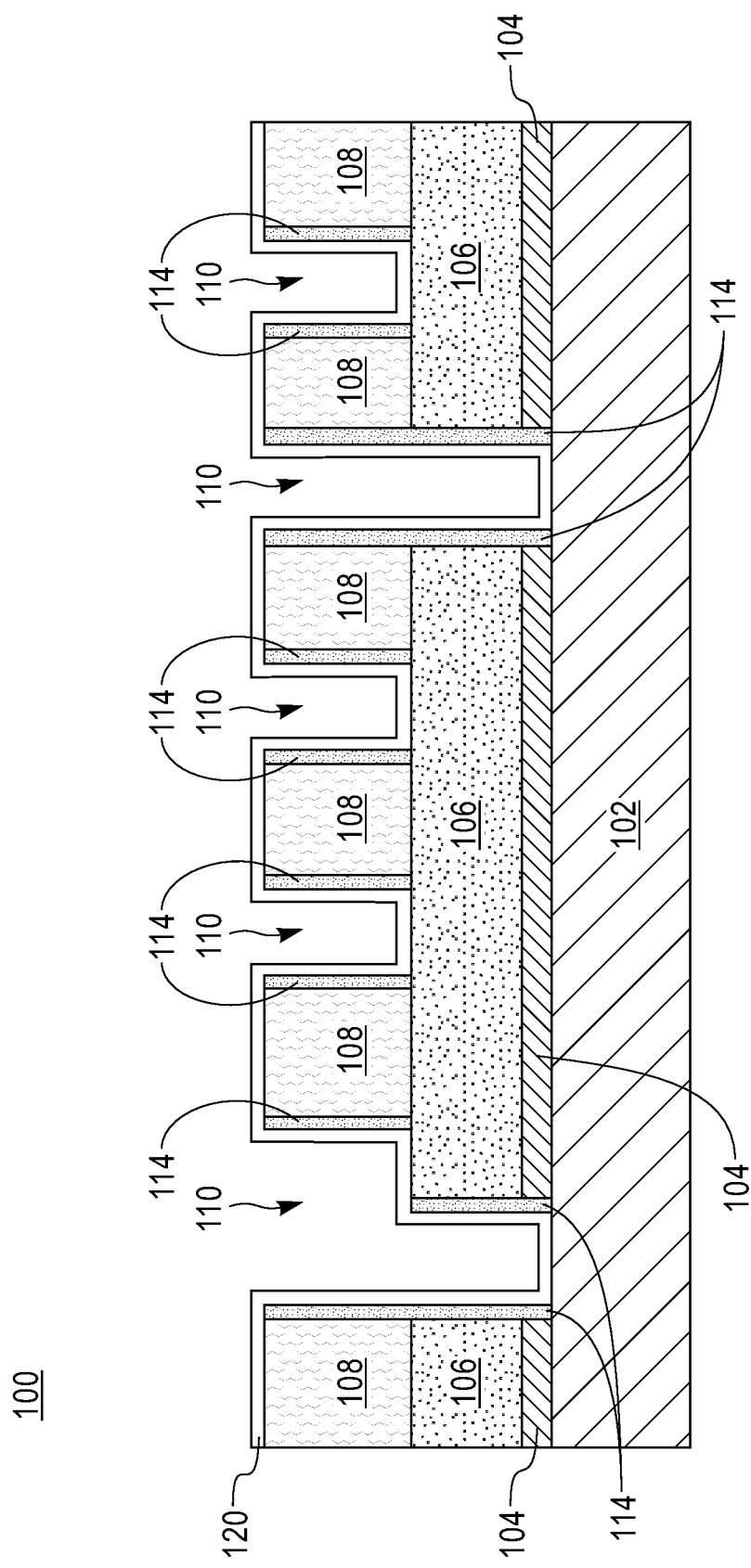
FIG. 6 depicts depositing a barrier liner, according to an embodiment of the present disclosure.

Referring now to FIG. 6, a cross-sectional view of the semiconductor device 100 depicting forming a barrier liner 120 is shown, according to an embodiment of the present disclosure. The barrier liner 120 may be conformally deposited along a perimeter formed by the interconnect openings 110 and exposed top surfaces of the sacrificial dielectric layer 108. The barrier liner 120 may be above and in direct contact with the dense dielectric spacer 114 located along sidewalls of the interconnect openings 110.

Typically, the barrier liner 120 may be composed of titanium (Ti), tantalum (Ta), tungsten (W), titanium nitride (TiN), tantalum nitride (TaN), tungsten nitride (WN), Cobalt (Co), Ruthenium (Ru), Manganese Nitride ($Mn_3N_2$), a combination thereof, or an alloy thereof. The barrier liner 120 may adhere to the dense dielectric spacer 114 and first dielectric layer 106 hindering the diffusion of conductive materials such as copper or impurities such as oxygen across the barrier liner 120. The barrier liner 120 may be formed by PVD, CVD, ALD, electroless plating, evaporation, or any other suitable deposition method.

In an embodiment, the thickness of the barrier liner 120 may vary from approximately 0.5 nm to approximately 10 nm and ranges there between. In another embodiment, the barrier liner 120 may have a thickness varying from approximately 2 nm to approximately 3 nm. As mentioned above, the presence of the dense dielectric spacer 114 may enhance the nucleation of the barrier liner 120, thus allowing the barrier liner 120 to be substantially thinner than conventional barrier liners formed in current dual-damascene integration schemes. As a result of having a thinner barrier liner 120, interconnect resistance of the semiconductor device 100 may be reduced.

It should be noted that the minimum thickness achieve in current process of record (POR) for metal barrier liners may be of approximately 5 nm, while the thickness achieved by applying the method described above may be of approximately 2.5 nm. A reduction of approximately 25% in device resistance has been observed as a result of achieving a substantially thinner barrier liner.

Figure 7:
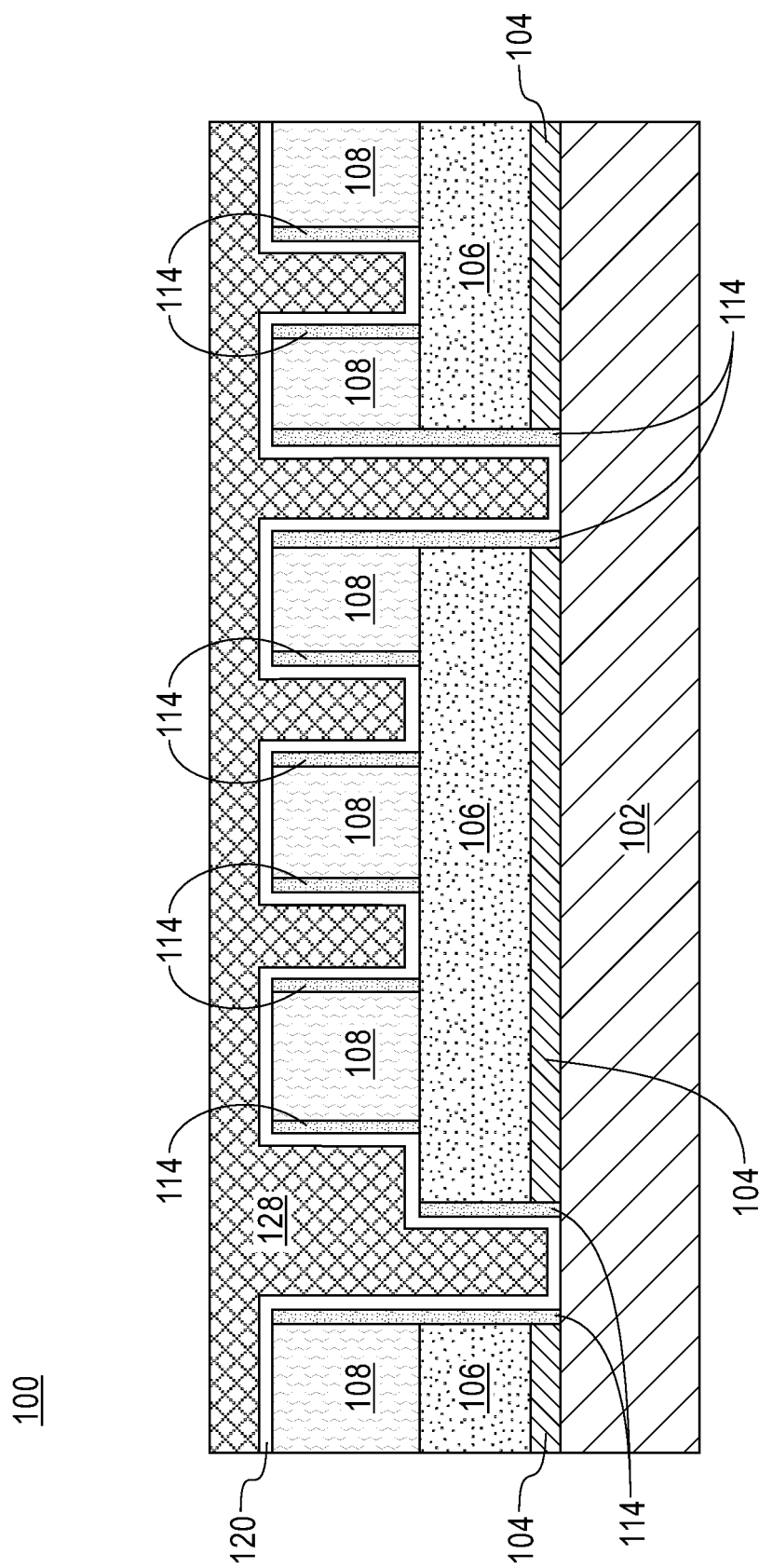
FIG. 7 depicts a metallization process, according to an embodiment of the present disclosure.

Referring now to FIG. 7, a cross-sectional view of the semiconductor device 100 depicting forming a conductive material 128 is shown, according to an embodiment of the present disclosure. The conductive material 128 may be deposited directly on a top surface of the barrier liner 120.

The conductive material 128 may be formed by electroplating, electroless plating, PVD, CVD, or any combination thereof. In an embodiment of the present disclosure, the conductive material 128 may be formed by PVD of a thin seed layer containing a metal (not shown) and electroplating of the same or similar metal. The conductive material 128 may typically include copper, however other metals such as aluminum (Al), gold (Au), silver (Ag) and tungsten (W) may also be considered. The conductive material 128 may further include dopants, such as, for example, manganese, magnesium, copper, aluminum, or other known dopants.

A thickness of the conductive material 128 may be enough to entirely fill the interconnect openings 110 (FIG. 6). In an embodiment, the thickness of the conductive material 128 may exceed the depth of the interconnect openings 110 (FIG. 6) as shown in the figure. In this case, the thickness of the conductive material 128 may vary between approximately 100 nm to approximately 1 µm.

Figure 8:
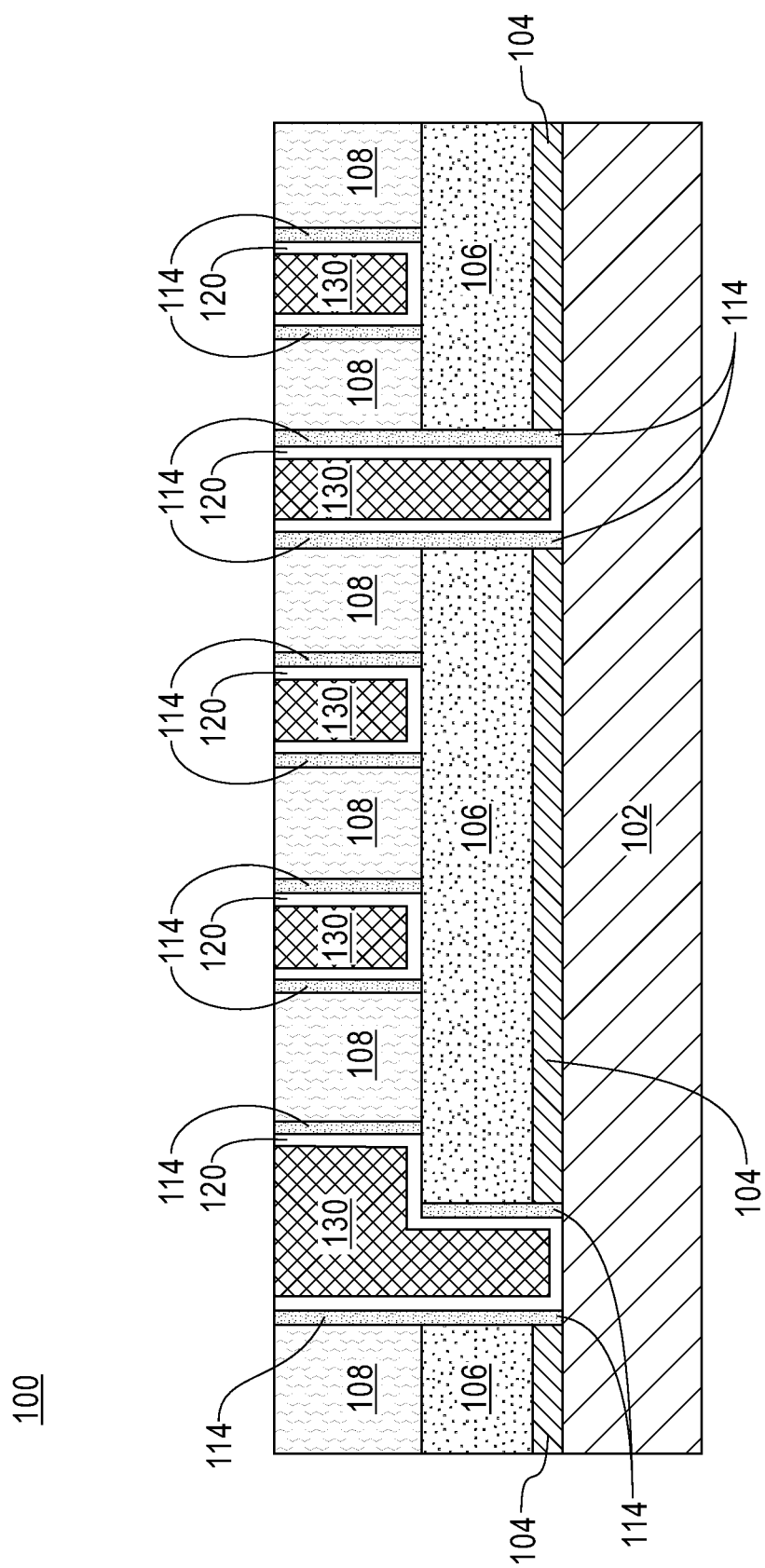
FIG. 8 depicts a planarization process, according to an embodiment of the present disclosure.

Referring now to FIG. 8, a cross-sectional view of the semiconductor device 100 depicting planarization of the conductive material 128 is shown, according to an embodiment of the present disclosure. The planarization may be conducted by any method known in the art, for example, by chemical mechanical polishing (CMP) of areas of the conductive material 128 exceeding the depth of the interconnect openings 110 shown in FIG. 7. Additionally, during the planarization process, uppermost areas of the barrier liner 120 may also be removed as shown in the figure.

In some embodiments, the barrier liner 120 may serve as a stop layer during planarization of the conductive material 128. In such cases, the planarization process may be a two step-process. The first step may include a self-stopping process to remove the excess conductive material 128 above portions of the barrier liner 120 located on top of uppermost surfaces of the sacrificial dielectric layer 108 (FIG. 7). The second step in the planarization process may include removing the barrier liner 120 from the uppermost surface of the sacrificial dielectric layer 108 (FIG. 7) to expose top surfaces of the sacrificial dielectric layer 108. The planarization process may stop once a desired thickness of the sacrificial dielectric layer 108 may be reached based on a predetermined chip design.

After planarization of the conductive material 128 (FIG. 7) has been finished interconnect openings 110 (FIG. 6), now filled with the conductive material 128 (FIG. 7), become interconnect structures 130.

Figure 9:
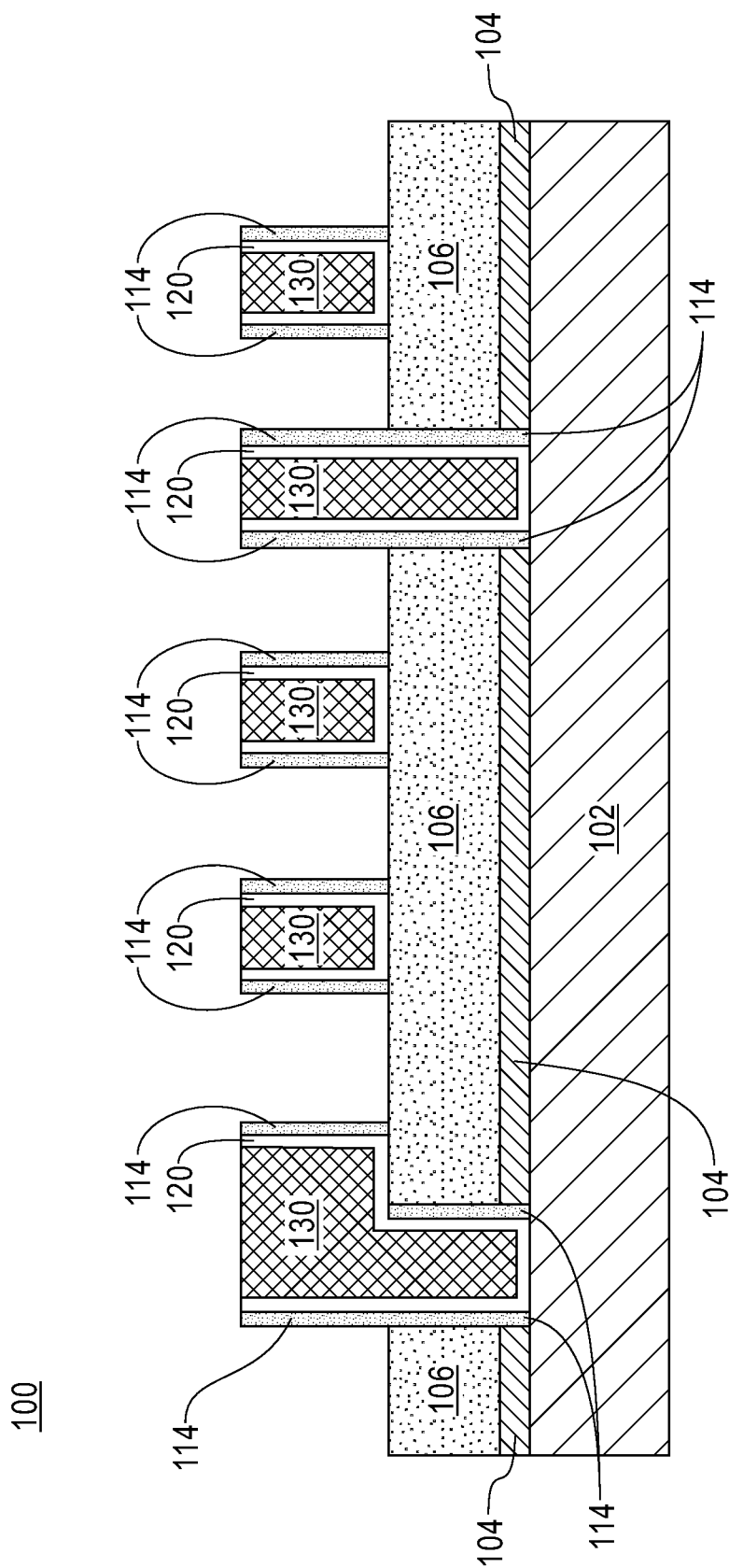
FIG. 9 depicts removing the sacrificial dielectric layer, according to an embodiment of the present disclosure.

Referring now to FIG. 9, a cross-sectional view of the semiconductor device 100 depicting removing the sacrificial dielectric layer 108 is shown, according to an embodiment of the present disclosure. The sacrificial dielectric layer 108 may be removed by, for example, a selective reactive ion etching technique. In some embodiments, wet-chemical etching and cleaning may be used to remove the sacrificial dielectric layer 108 from the semiconductor device 100.

It should be noted that removal of the sacrificial dielectric layer 108 exposes portions of the dense dielectric spacer 114 positioned above the first dielectric layer 106.

Figure 10:
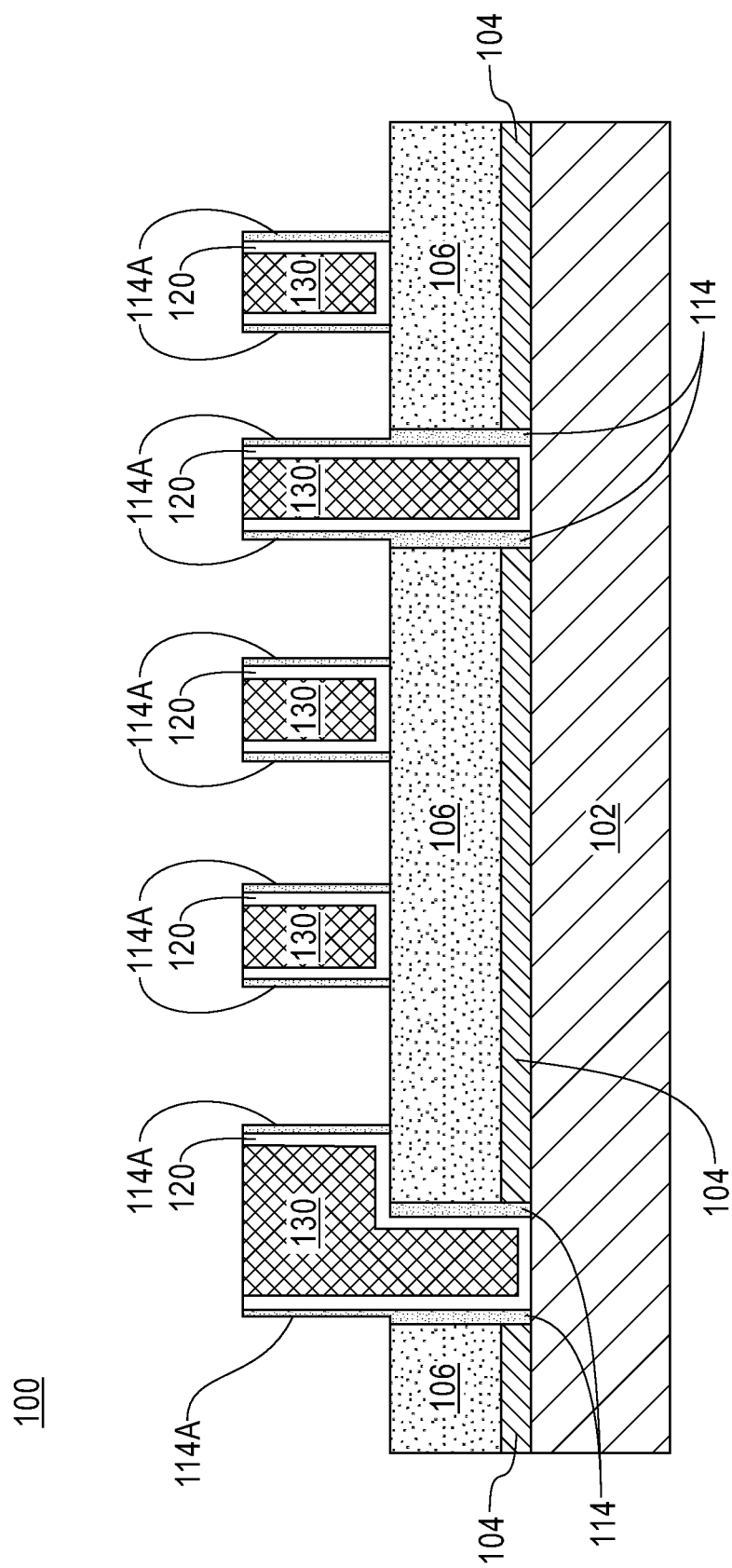
FIG. 10 depicts reducing a thickness of the dense dielectric spacer, according to an embodiment of the present disclosure.

Referring now to FIG. 10, a cross-sectional view of the semiconductor device 100 depicting thinning of the dense dielectric spacer 114 is shown. In this embodiment, a thickness of exposed portions of the dense dielectric spacer 114 may be reduced by any method known in the art. Specifically, the thickness of exposed portions of the dense dielectric spacer 114 located directly above the first dielectric layer 106 may be reduced by anisotropic etch processes, such as dry etch, reactive ion etching (RIE), or other plasma etching process.

After thinning of exposed portions of the dense dielectric spacer 114, a thinned dense dielectric spacer 114A may remain as shown in the figure. Exposed portions of the dense dielectric spacer 114 may be trimmed until a thickness of approximately 1 nm to approximately 2 nm is reached. In some embodiments, the thinned dense dielectric spacer 114A may have a thickness of approximately 1.5 nm. In embodiments in which the thickness of exposed portions of the dense dielectric spacer 114 is not reduced, an increase in capacitance may be observed in the semiconductor device 100.

Since the dielectric constant of the dense dielectric spacer 114 is higher than a dielectric constant of both the first dielectric layer 106 and a subsequently formed second dielectric layer 140 (FIG. 11), thinning or trimming down upper portions of the dense dielectric spacer 114 may help reduce an effective dielectric contribution in the semiconductor device after completion of the integration process. Stated differently, by reducing the thickness of the dense dielectric spacer 114, a lower effective dielectric constant as well as a lower capacitance may be achieve in the semiconductor device 100.

Figure 11:
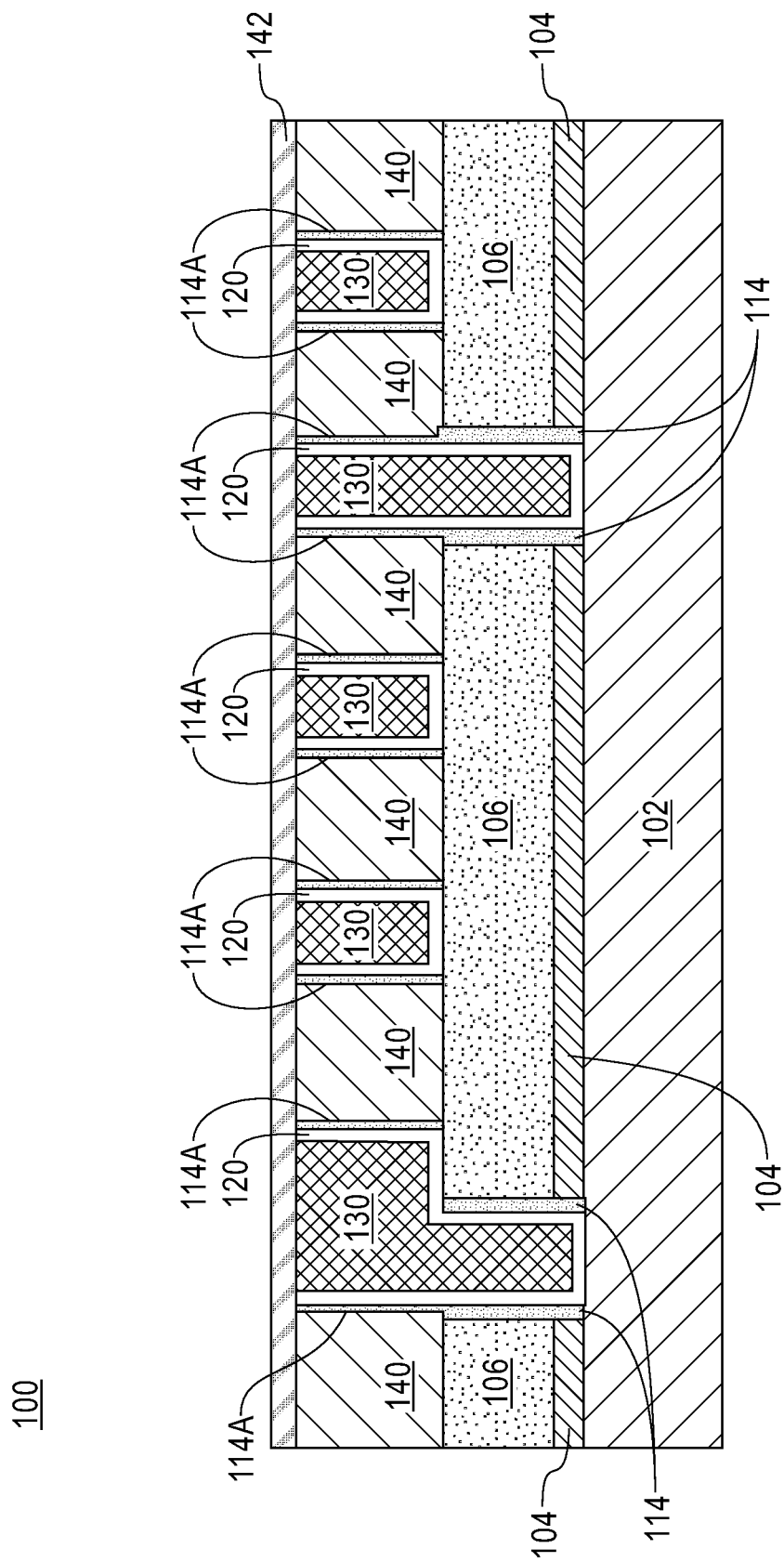
FIG. 11 depicts depositing a low-k dielectric material, according to an embodiment of the present disclosure.

Referring now to FIG. 11, a cross-sectional view of the semiconductor device 100 depicting deposition of a second dielectric layer 140 and a second cap layer 142 is shown, according to an embodiment of the present disclosure.

The second dielectric layer 140 may be deposited to fill spaces or gaps (not shown) remaining in the semiconductor device 100 after removal of the sacrificial dielectric layer 108 and formation of the thinned dense dielectric spacer 114A. Stated differently, the sacrificial dielectric layer 108 (FIG. 9) is replaced by the second dielectric layer 140.

The second dielectric layer 140 may be deposited by any suitable deposition process such as, for example, CVD, PECVD, HDCVD, PVD, plating, sputtering, evaporation, and chemical solution deposition of a dielectric material. The second dielectric layer 140 may include, for example, a low-k dielectric material having a dielectric constant, k, of approximately 2.1. In some embodiments, the second dielectric layer 140 may include a high-porosity extreme-low-k (ELK) dielectric material. In other embodiments, the second dielectric layer 140 may include an ultra-low-k (ULK) dielectric material.

A thickness of the second dielectric layer 140 may vary from approximately 100 nm to approximately 500 nm and ranges there between, although a thickness less than 100 nm and greater than 500 nm may be acceptable.

It should be noted that due to the substantially low dielectric constant of high-porosity ELK and ULK dielectric materials, a lower capacitance may be achieve in the semiconductor device 100. Additionally, by using high-porosity ELK or ULK dielectric materials, the second dielectric layer 140 may be formed without air-gap structures, which in turn may reduce the number of mask sets needed during manufacturing of the semiconductor device 100.

Moreover, the combination barrier liner 120/dense dielectric spacer 114 could not be formed in a damascene trench formed in a low-k dielectric material, such as, the second dielectric layer 140. Since the second dielectric 140 may include extremely low-k materials (k of approximately 2.0-2.2), during typical dual-damascene processes such as, for example, RIE, wet clean, pre-clean and CMP, the second dielectric 140 may be substantially damaged which causes an increase in the effective dielectric constant. In the method described above, no damage is caused to the second dielectric layer 140 since it is deposited after forming the damascene structure.

Then, a continuous second cap layer 142 is typically deposited over the planarized surface featuring the second dielectric layer 140 and interconnect structures 130. The second cap layer 142 may be deposited by any deposition method known in the art such as CVD, PECVD, HDCVD, or PVD. The second cap layer 142 may have a thickness varying from approximately 15 nm to approximately 30 nm and ranges there between, although a thickness less than 15 nm and greater than 30 nm may be acceptable.

Similar to the first cap layer 104, the second cap layer 142 may include an insulator of silicon nitride, silicon carbide or the like which may function as both a barrier, particularly when a low-k material that may be subject to diffusion of moisture is used as interlevel dielectric, and an etch stop for a subsequent via level. In an embodiment of the present disclosure, the second cap layer 142 may include a dielectric material such as nitrogen-doped silicon carbide (NBLoK).

Therefore, the utilization of the sacrificial dielectric layer 108 and the thinned dense dielectric spacer 114A may enable ultrathin liner metallization and backfill with low-k dielectric materials (e.g., ULK/ELK dielectrics). Doing so may result in improved device performance. As such, embodiments of the present disclosure may, among other potential benefits, allow formation of ultrathin metal barrier liners to lower resistance, formation of thinned dense dielectric spacers to provide a lower effective dielectric constant in the integrated structure, backfill with high-porosity ELK or ULK dielectric materials to provide lower capacitance and no-damage layer without air-gap structures which may typically require additional mask sets. Finally, embodiments of the present disclosure may provide a lower capacitance and lower resistance structure with enhanced reliability and barrier properties.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, the method comprising:
   forming a dielectric spacer only along sidewalls of a plurality of interconnect openings, wherein the interconnect openings extend through a sacrificial dielectric layer and a first dielectric layer until a top portion of a first conductive material, wherein the dielectric spacer comprises a dielectric material having a dielectric constant higher than a dielectric constant of the sacrificial dielectric layer and higher than a dielectric constant of the first dielectric layer;
   conformally depositing a barrier liner adjacent to and in direct contact with the dielectric spacer within the plurality of interconnect openings;
   filling the interconnect openings with a second conductive material;

removing the sacrificial dielectric layer, wherein removing the sacrificial dielectric layer exposes portions of the dielectric spacer directly above the first dielectric layer; and reducing a thickness of exposed portions of the dielectric spacer.

2. The method of claim 1, wherein the barrier liner is adjacent to and in direct contact with the dielectric spacer enhances nucleation of the barrier liner and allows a thickness of the barrier liner to be reduced, the barrier liner comprising a thickness varying from approximately 2 nm to approximately 3 nm.

3. The method of claim 1, wherein the dielectric spacer comprises a dielectric material having a dielectric constant varying between approximately 3 to approximately 6.

4. The method of claim 1, wherein reducing the thickness of the exposed portions of the dielectric spacer allows achieving a lower effective dielectric constant in the semiconductor device, the thickness of the exposed portions of the dielectric spacer varies from approximately 1 nm to approximately 2 nm.

5. The method of claim 1, wherein forming the plurality of interconnect openings further comprises:
removing a top portion of a first cap layer to expose the first conductive material.

6. The method of claim 1, further comprising:
depositing a second dielectric layer in the semiconductor device, wherein a dielectric constant of the second dielectric layer is lower than the dielectric constant of the dielectric spacer; and
forming a second cap layer directly above the second dielectric layer.

7. The method of claim 6, wherein the second dielectric layer comprises a high-porosity extreme-low-k dielectric material or an ultra-low-k dielectric material.

8. A method of forming a semiconductor device, the method comprising:
depositing a sacrificial dielectric layer directly above a first dielectric layer, the first dielectric layer is directly above a first metal level of the semiconductor device;
forming a plurality of interconnect openings, wherein the plurality of interconnect openings extend through the sacrificial dielectric layer and the first dielectric layer until a top portion of a first conductive material in the first metal level;
conformally depositing a dense dielectric material along a first perimeter formed by top surfaces of the sacrificial dielectric layer, sidewalls of the plurality of interconnect openings and a bottom of the plurality of interconnect openings,
wherein the dense dielectric material has a dielectric constant higher than a dielectric constant of the sacrificial dielectric layer and higher than a dielectric constant of the first dielectric layer;
removing the dense dielectric material from areas of the semiconductor device parallel to the first metal level, wherein the dense dielectric material remains on sidewalls of the plurality of interconnect openings to form dense dielectric spacers;
depositing a barrier liner in direct contact with top surfaces of the sacrificial dielectric layer, the dense dielectric spacers and the bottom of the plurality of interconnect openings;
depositing a second conductive material above and in direct contact with the barrier liner, wherein the second conductive material fills the plurality of interconnect openings to form interconnect structures;

planarizing the conductive material, wherein the barrier liner is removed from above top surfaces of the sacrificial dielectric layer during planarization of the conductive material;
removing the sacrificial dielectric layer such that portions of the dense dielectric spacers above the first dielectric layer are exposed; and
reducing a thickness of exposed portions of the dense dielectric spacers.

9. The method of claim 8, wherein the barrier liner being deposited in direct contact with the dense dielectric spacers enhances nucleation of the barrier liner and allows a thickness of the barrier liner to be reduced, the barrier liner comprising a thickness varying from approximately 2 nm to approximately 3 nm.

10. The method of claim 8, wherein the dense dielectric material has a dielectric constant varying between approximately 3 to approximately 6.

11. The method of claim 8, wherein reducing the thickness of the exposed portions of the dense dielectric spacers allows achieving a lower effective dielectric constant in the semiconductor device, the thickness of the exposed portions of the dense dielectric spacers varies from approximately 1 nm to approximately 2 nm.

12. The method of claim 8, wherein forming the plurality of interconnect openings further comprises:
removing a top portion of a first cap layer to expose the first conductive material.

13. The method of claim 8, further comprising:
depositing a second dielectric layer in the semiconductor device, wherein a dielectric constant of the second dielectric layer is lower than the dielectric constant of the dense dielectric spacer, the second dielectric layer fill spaces between the interconnect structures; and
forming a second cap layer directly above the second dielectric layer.

14. The method of claim 13, wherein the second dielectric layer comprises a high-porosity extreme-low-k dielectric material or an ultra-low-k dielectric material.

15. A semiconductor device comprising:
a plurality of interconnect structures extending through a first dielectric layer and a second dielectric layer until a top surface of a first metal level, wherein the second dielectric layer is above the first dielectric layer;
a conductive material within each interconnect structure, wherein the conductive material is at the same height as a first portion of a barrier liner directly above the first dielectric layer;
a thinned dielectric spacer adjacent to and in direct contact with the first portion of the barrier liner directly above the first dielectric layer and in direct contact with the second dielectric layer; and
a dielectric spacer adjacent to and in direct contact with a second portion of the barrier liner located below the second dielectric layer and in direct contact with the first dielectric layer,
wherein the thinned dielectric spacer and the dielectric spacer comprise a dielectric constant higher than a dielectric constant of the first dielectric layer and higher than a dielectric constant of the second dielectric layer.

16. The semiconductor device of claim 15, wherein the first portion of the barrier liner adjacent and in direct contact with the thinned dielectric spacer and the second portion of the barrier liner adjacent and in direct contact with the dielectric spacer enhance nucleation of the barrier liner and allows a thickness of the barrier liner to be reduced, the barrier liner comprising a thickness varying from approximately 2 nm to approximately 3 nm.

17. The semiconductor device of claim 15, wherein the thinned dielectric spacer and the dielectric spacer comprise a dielectric material having a dielectric constant varying between approximately 3 to approximately 6.

18. The semiconductor device of claim 15, wherein the thinned dielectric spacer has a thickness varying between approximately 1 nm to approximately 2 nm, the thickness of the thinned dielectric causes a lower effective dielectric constant in the semiconductor device.

19. The semiconductor device of claim 15, wherein the dielectric spacer has a thickness varying between approximately 3 nm to approximately 6 nm.

20. The semiconductor device of claim 15, wherein the second dielectric layer comprises a high-porosity extreme-low-k dielectric material or an ultra-low-k dielectric material.

* * * * *